(12) United States Patent
Zhang et al.

(10) Patent No.: US 10,154,542 B2
(45) Date of Patent: Dec. 11, 2018

(54) COMPOSITE DEVICE WITH CYLINDRICAL ANISOTROPIC THERMAL CONDUCTIVITY

(71) Applicant: Watlow Electric Manufacturing Company, St. Louis, MO (US)

(72) Inventors: Sanhong Zhang, Ballwin, MO (US); Kevin Ptasienski, O'Fallon, MO (US); Kevin R. Smith, Columbia, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 392 days.

(21) Appl. No.: 14/886,783

(22) Filed: Oct. 19, 2015

(65) Prior Publication Data
US 2017/0111958 A1    Apr. 20, 2017

(51) Int. Cl.
*H05B 3/68* (2006.01)
*H05B 1/02* (2006.01)
*H05B 3/26* (2006.01)
*H01L 21/67* (2006.01)

(52) U.S. Cl.
CPC ..... *H05B 1/0233* (2013.01); *H01L 21/67103* (2013.01); *H01L 21/67109* (2013.01); *H01L 21/67115* (2013.01); *H05B 3/267* (2013.01)

(58) Field of Classification Search
CPC ......... H01L 21/67103; H01L 21/67109; H01L 21/67115; H05B 1/0233; H05B 3/267
USPC ............................................. 219/443.1–468.2
See application file for complete search history.

(56) References Cited

U.S. PATENT DOCUMENTS

| | | | |
|---|---|---|---|
| 5,302,851 A * | 4/1994 | Ree | H01L 23/49894 257/643 |
| 5,536,918 A | 7/1996 | Ohkase et al. | |
| 6,410,172 B1 | 6/2002 | Gilbert, Sr. | |
| 6,639,189 B2 | 10/2003 | Ramanan et al. | |
| 6,838,645 B2 | 1/2005 | Choi et al. | |
| 7,329,842 B2 | 2/2008 | Kushihashi et al. | |
| 7,364,624 B2 | 4/2008 | Mariner et al. | |
| 7,425,689 B2 * | 9/2008 | Kulp | H01L 21/67109 118/725 |

(Continued)

FOREIGN PATENT DOCUMENTS

| | | |
|---|---|---|
| EP | 1272006 | 1/2003 |
| WO | 2002/041370 | 5/2002 |
| WO | 2005/008749 | 1/2005 |

OTHER PUBLICATIONS

International Search Report for International Application PCT/US2016/056547, dated Dec. 6, 2016.

*Primary Examiner* — Sang Y Paik
(74) *Attorney, Agent, or Firm* — Burris Law, PLLC

(57) ABSTRACT

An apparatus for supporting a substrate in a process chamber and regulating surface temperature of the substrate and method of making the same is provided. The apparatus includes a base support having a surface adapted to support the substrate and a heater for heating the substrate with the heater being disposed proximate the base support. The base support is made of a composite material comprising a plurality of thermally conductive arcuate members embedded within a matrix, each of the plurality thermally conductive arcuate members being arranged concentrically and defining predetermined intervals in a radial direction such that the composite material provides an anisotropic thermal conductivity in radial ($\rho$), azimuthal ($\varphi$) and axial (z) directions in a cylindrical coordinate system of the base support.

19 Claims, 5 Drawing Sheets

(56) References Cited

U.S. PATENT DOCUMENTS

| | | |
|---|---|---|
| 7,901,509 B2 | 3/2011 | Mariner et al. |
| 8,207,476 B2 | 6/2012 | Tsukamoto et al. |
| 8,536,494 B2 | 9/2013 | Benjamin et al. |
| 2003/0089457 A1 | 5/2003 | Nallan et al. |
| 2006/0076109 A1* | 4/2006 | Holland ............ H01L 21/67103 |
| | | 156/345.27 |
| 2006/0096946 A1 | 5/2006 | Schaepkens et al. |
| 2008/0066676 A1 | 3/2008 | Mariner et al. |
| 2012/0247672 A1 | 10/2012 | Kobayashi |
| 2014/0360430 A1 | 12/2014 | Armour et al. |
| 2016/0035610 A1* | 2/2016 | Park .................... H01L 21/6833 |
| | | 156/345.29 |
| 2016/0149482 A1* | 5/2016 | Criminale ................. H02J 3/14 |
| | | 219/444.1 |
| 2016/0158738 A1* | 6/2016 | Ozaki ..................... B01J 35/02 |
| | | 502/159 |

* cited by examiner

COMPOSITE DEVICE WITH CYLINDRICAL ANISOTROPIC THERMAL CONDUCTIVITY

FIELD

The present disclosure relates to an apparatus that includes a heater system capable of delivering a precise temperature profile to a heating target during operation in order to compensate for heat loss and/or other variations. The apparatus may be used in a variety of applications, including but not limited to semiconductor processing.

BACKGROUND

The statements in this section merely provide background information related to the present disclosure and may not constitute prior art.

In the art of semiconductor processing, for example, a chuck or susceptor is used to hold a substrate (or wafer) and to provide a uniform temperature profile to the substrate during processing. This support assembly may include the electrostatic chuck with an embedded electrode, and a heater plate that is bonded to the electrostatic chuck through an adhesive layer. A heater is secured to the heater plate, which can be an etched-foil heater, by way of example.

This heater assembly is bonded to a cooling plate, again through an adhesive layer. The substrate is disposed on the electrostatic chuck, and the electrode is connected to a voltage source such that electrostatic power is generated, which holds the substrate in place. A radio frequency (RF) or microwave power source may be coupled to the electrostatic chuck within a plasma reactor chamber that surrounds the support assembly. The heater thus provides requisite heat to maintain temperature on the substrate during various in-chamber plasma semiconductor processing steps, including plasma enhanced film deposition or etch.

During all phases of processing of the substrate, the temperature profile of the electrostatic chuck is tightly controlled in order to reduce processing variations within the substrate being etched, while reducing total processing time. Devices and methods for improving temperature uniformity on the substrate are continually desired in the art of semiconductor processing, among other applications.

SUMMARY

In one form of the present disclosure, an apparatus for supporting a substrate in a process chamber and regulating surface temperature of the substrate is provided. The apparatus comprises a base support that includes a surface adapted to support the substrate and a heater disposed proximate the base support for heating the substrate. The base support is made of a composite material comprising a plurality of thermally conductive arcuate members embedded within a matrix. Each of the plurality thermally conductive arcuate members are arranged concentrically and define predetermined intervals in a radial direction such that the composite material provides an anisotropic thermal conductivity in radial ($\rho$), azimuthal ($\varphi$) and axial (z) directions in a cylindrical coordinate system of the base support. The thermally conductive members may be arranged such that the thermal conductivity in the azimuthal direction is higher than the radial or axial directions. In one form, the heater is a layered heater.

The thermally conductive arcuate members may define continuous rings. The arcuate members may also define symmetrical segments arranged in zones. The arcuate members may be made of the same or different materials and may have similar or different lengths. The arcuate members may also exhibit variable width or define variable trace geometry and/or be provided in geometries other than arcs, such as by way of example, polygons or discontinuous segments of a variety of shapes.

According to another aspect of the present disclosure, the matrix may be without limitation a polyimide material. This polyimide material may be, but not limited to, a polyoxydiphenylene-pyromellitimide material.

According to yet another aspect of the present disclosure, the thermally conductive members are graphite fibers. When about 10% by weight of the base support comprises the graphite fibers, the thermal conductivity of the base support in one form in the radial and axial directions is at least 0.4 W/mK. When about 88% by weight of the base support comprises the graphite fibers, the thermal conductivity of the base support in one form in the radial and axial directions is less than 6.0 W/mK.

Alternatively, the thermal conductivity of the base support in one form in the azimuthal direction is at least 80 W/mK when about 8% by weight of the base support comprises the graphite fibers. When about 90% by weight of the base support comprises the graphite fibers, the thermal conductivity of the base support in one form in the azimuthal direction is less than 900 W/mK.

In another form of the present disclosure, an apparatus is provided that supplies heat to a target part. The apparatus comprises a base support made of a composite material comprising at least one thermally conductive arcuate member embedded within a matrix, wherein the composite material provides an anisotropic thermal conductivity in radial ($\rho$), azimuthal ($\varphi$) and axial (z) directions in a cylindrical coordinate system of the base support. When desirable the apparatus may further comprise a plurality of thermally conductive arcuate members arranged concentrically and defining predetermined intervals in a radial direction. These arcuate members may define continuous rings or other configurations as set forth above and further illustrated and described herein.

In still another form of the present disclosure, a method of providing heat to a target part is provided. This method comprises providing a base support made of a composite material and applying heat to the base support through an adjacent component. The composite material comprises a plurality of thermally conductive arcuate members embedded within a matrix, each of the plurality thermally conductive arcuate members being arranged concentrically and defining predetermined intervals in a radial direction. The composite material provides an anisotropic thermal conductivity in radial ($\rho$), azimuthal ($\varphi$) and axial (z) directions in a cylindrical coordinate system of the base support.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
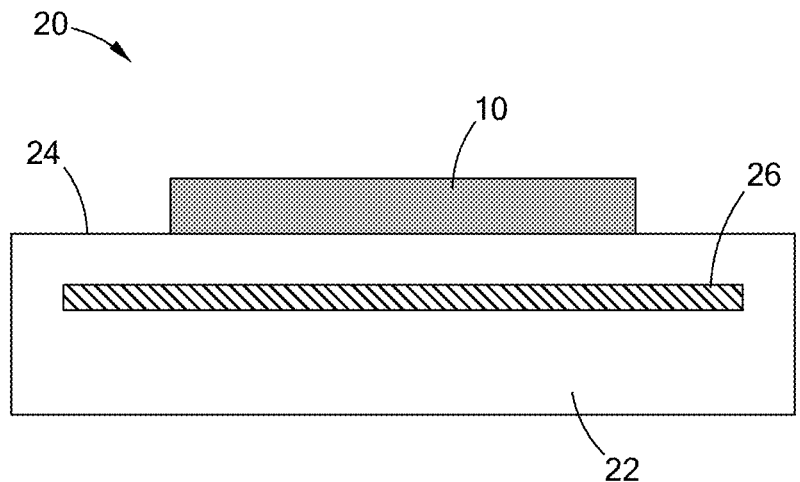
FIG. 1 is a side cross-sectional view of an apparatus constructed according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. For example, the following forms of the present disclosure are directed to support assemblies for chucks for use in semiconductor processing, and in some instances, electrostatic chucks. However, it should be understood that the support assemblies and systems provided herein may be employed in a variety of applications and are not limited to semiconductor processing applications. It should be understood that throughout the drawings, corresponding reference numerals indicate like or corresponding parts and features.

Referring to FIG. 1, an apparatus 20 for supporting a substrate 10 in a process chamber and regulating surface temperature of the substrate 10 is generally provided. The apparatus 20 comprises a base support 22 that includes a surface 24 adapted to support the substrate 10 and a heater 26 disposed proximate the base support 22 for heating the substrate 10. Further descriptions of such heaters and their materials relevant to the present disclosure are disclosed in U.S. Pat. No. 7,196,295 and pending U.S. patent application Ser. Nos. 11/475,534 and 13/599,648, which are commonly assigned with the present application and the disclosures of which are incorporated herein by reference in their entirety.

In one form, the heater may be a layered heater. As used herein, a layered heater is defined as a heater comprising at least one layer formed by a layered process. In other words, as used herein, the term "layered heater" should be construed to include heaters that comprise at least one functional layer (e.g., bond coat layer, dielectric layer, resistive heating layer, protective layer, over coat layer, among others), wherein the layer is formed through application or accumulation of a material to a substrate or another layer using processes associated with thick film, thin film, thermal spraying, or sol-gel, among others. These processes are also referred to as "layered processes," "layering processes," or "layered heater processes." The primary difference between these types of layered heaters is the method in which the layers are formed. For example, the layers for thick film heaters are typically formed using processes such as screen printing, decal application, or film printing heads, among others. The layers for thin film heaters are typically formed using deposition processes such as ion plating, sputtering, chemical vapor deposition (CVD), and physical vapor deposition (PVD), among others. Yet another series of processes distinct from thin and thick film techniques are those known as thermal spraying processes, which may include by way of example flame spraying, plasma spraying, wire arc spraying, and HVOF (High Velocity Oxygen Fuel), among others.

Figure 2A:
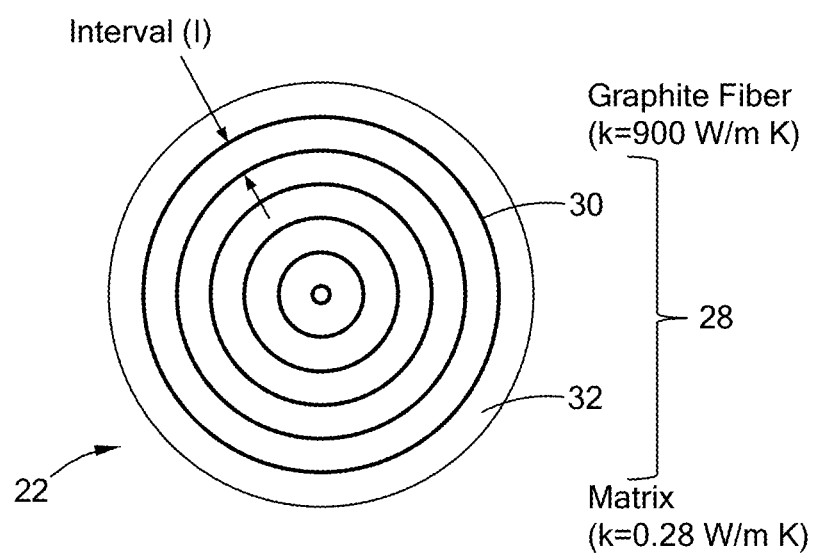
FIGS. 2A through 2D are plan views of a base support showing various forms of thermally conductive members embedded within a matrix composite and constructed according to the teachings of the present disclosure.
Figure 2B:
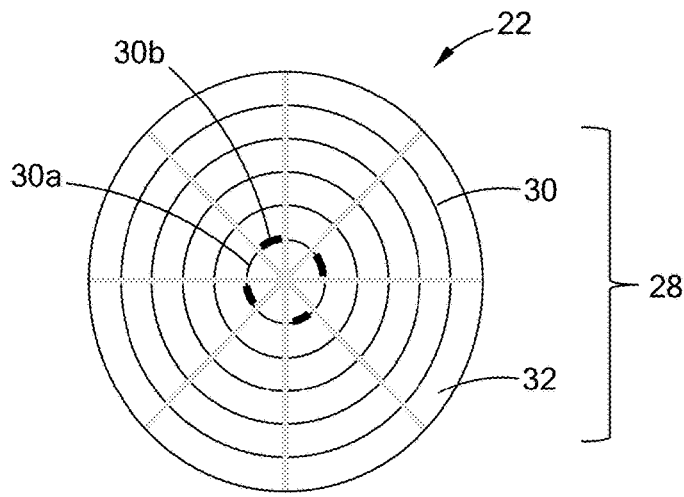
Figure 2C:
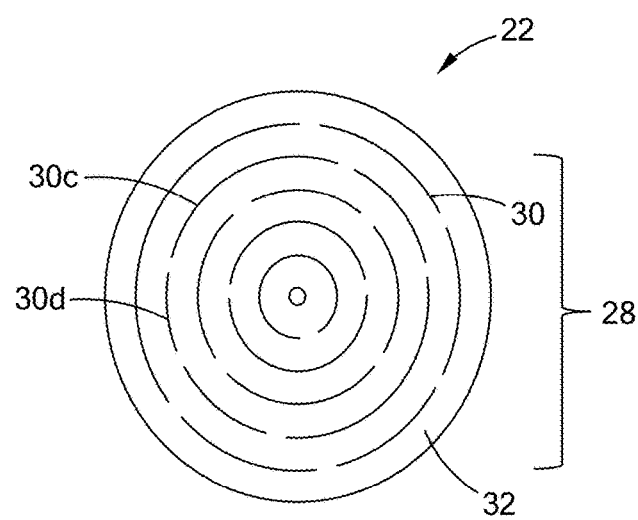

Referring now to FIGS. 2A through 2D, the base support 22 is a composite material 28 comprising a plurality of thermally conductive arcuate members 30 embedded within a matrix material 32. In one form, the arcuate members 30 define continuous rings as shown. The arcuate members 30 in an alternate form define symmetrical segments arranged in zones as shown in FIGS. 2B and 2C. For example, in FIG. 2B, the arcuate members 30 are shown as discontinuous concentric arcs, which are arranged to define different heater zones, which also reduce cross-talk (transmission of undesired electrical currents between successive concentric rings/segments) between zones. In FIG. 2C, the arcuate members 30 are distributed such that there is an overlap of the discontinuous concentric arcs in the radial direction, which also reduce cross-talk. Each of these arrangements are merely exemplary of different forms that the thermally conductive arcuate members 30 can take and should not be construed as limiting the scope of the present disclosure. Additionally, the thermally conductive arcuate members 30 may not be limited to an arc geometry in alternate forms of the present disclosure. Other geometries may include, by way of example, ellipses, B-curves (also known in the art as Bézier curves), lines, splines, and combinations thereof, among others. Accordingly, a geometric arc as a shape for the thermally conductive arcuate members 30 as illustrated and described herein should not be construed as limiting the scope of the present disclosure.

Figure 2D:
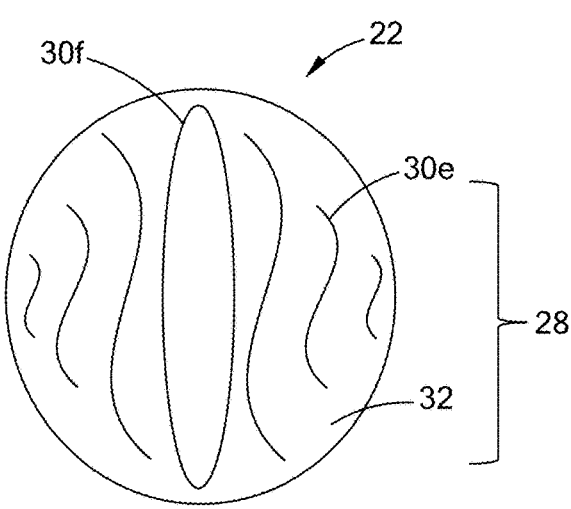

Still referring to FIGS. 2B through 2D, the thermally conductive arcuate members 30 may be made of the same or different materials and may have similar or different lengths 30c, 30d within a base support 22. Each of the thermally conductive arcuate members 30 may also exhibit a variable width 30a, 30b or define a variable trace geometry or path 30e, 30f. It should be understood that these shapes/geometries for the thermally conductive members are merely exemplary and should not be construed as limiting the scope of the present disclosure.

In one form, the thermally conductive arcuate members 30 comprise graphite fibers, although any thermally conductive material may be employed while remaining within the scope of the present disclosure. Such materials may include, by way of example, conductive metals, non-conductive materials coated or embedded within a conductive material, and in an exemplary form may comprise a plurality of filaments or strands that are woven or bonded together. These alternate materials and their forms are merely exemplary and should not be construed as limiting the scope of the present disclosure.

The matrix material 32, in one form, is a polyimide material. The polyimide material may be, without limitation, a poly-oxydiphenylene pyro-mellitimide material, such as poly-(4,4'-oxydiphenylene pyro-mellitimide) or Kapton® (DuPont USA). It should be understood that the polyimide material is merely exemplary and other matrix materials may be employed while remaining within the scope of the present disclosure, such as by way of example, Aluminum. Such materials may include, by way of example, a polymeric or ceramic material.

In accordance with the teachings of the present disclosure, and as shown in FIGS. 2A through 2C, the arcuate members 30 in one form are arranged concentrically and define predetermined intervals (I) in a radial direction such that the composite material 28 provides an anisotropic thermal conductivity in radial (ρ), azimuthal (φ) and axial (z) directions in a cylindrical coordinate system of the base support 22. When desirable, the thermally conductive arcuate members (30) may be arranged such that the thermal conductivity of the azimuthal (φ) direction is higher than the radial (ρ) or axial (z) directions. Further, the intervals (I) need not be consistent or the same across the base support 22, and instead, the size or spacing of the intervals (I) may vary in accordance with other forms of the present disclosure.

Figure 3:
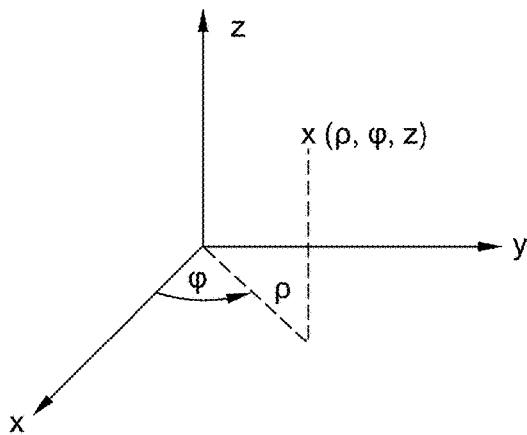
FIG. 3 is a graphical representation of a geometrical space associated with the cylindrical coordinates (p, φ, z) provided for purposes of reference.

Referring now to FIG. 3, the radial (ρ), azimuthal (φ) and axial (z) directions in a cylindrical coordinate system are shown for reference. A cylindrical coordinate system represents a three-dimensional coordinate system that specifies the position of a point x by its distance from a chosen reference axis, the direction from the axis relative to a chosen reference direction, and the distance from a chosen reference plane perpendicular to the axis. The point x in a cylindrical coordinate system can be identified by coordinates (ρ, φ, z) as shown, wherein p is the radial coordinate, φ is the angular coordinate or azimuthal and z is the height, longitudinal, or axial coordinate.

In one form, the base support 22 is prepared by aligning or arranging the thermally conductive arcuate members 30 into a desired shape or geometry, which is then encapsulated within the matrix material 36. For example, the thermally conductive arcuate members 30 are arranged onto at least one layer of matrix material, and then another at least one layer is placed over the thermally conductive arcuate members 30 to form the composite material 28.

The following examples are provided using a base support 22 that comprises graphite fibers as the thermally conductive arcuate members 30 arranged in concentric circles, with a Kapton® brand polyimide matrix material in order to more fully illustrate the benefits associated with the present disclosure. As set forth above, the incorporation and use of other thermally conductive members shaped into different patterns and encapsulated within matrix materials of alternate compositions is contemplated to be within the scope of the present disclosure.

Figure 4:
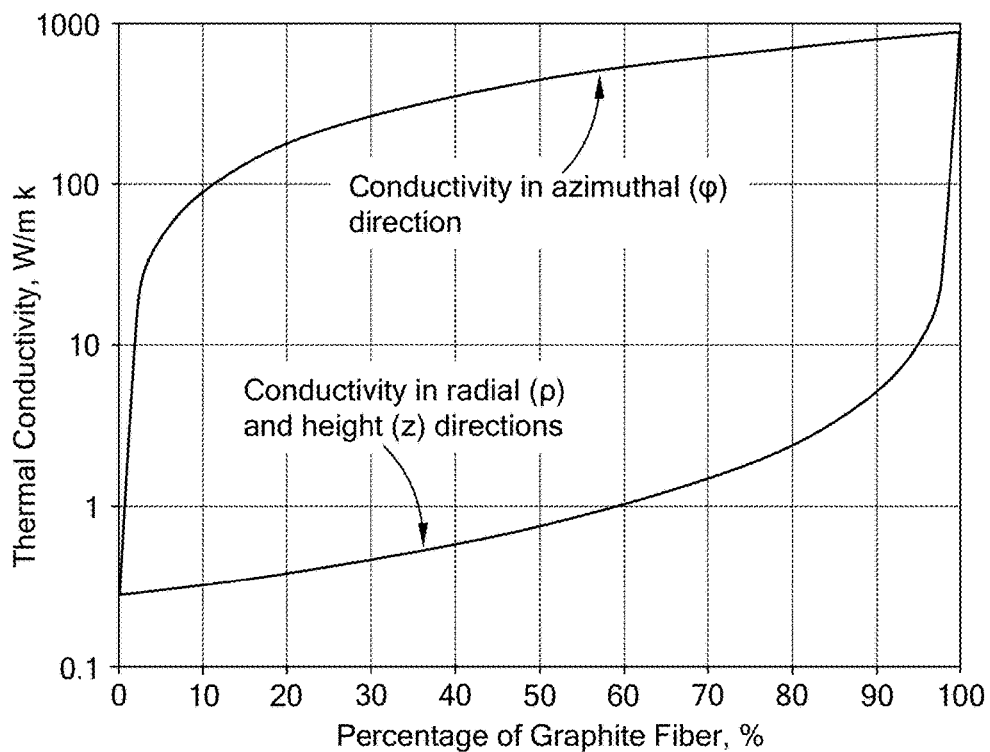
FIG. 4 is a graph of test data showing thermal conductivity exhibited by the base support in different directions plotted as a function of graphite fiber weight percent in one form of the present disclosure.

Referring now to FIG. 4, the thermal conductivity provided by the base support 22 in the azimuthal (φ) direction is greater than the thermal conductivity provided in the radial (ρ) or axial (z) directions in one form of the present disclosure as illustrated in FIG. 2A. More specifically, when about 10% by weight of the base support 22 comprises graphite fibers, the thermal conductivity of the base support 22 in the radial and axial directions is at least 0.4 W/mK. When about 88% by weight of the base support 22 comprises the graphite fibers, the thermal conductivity of the base support 22 in the radial and axial directions is less than 6.0 W/mK. Alternatively, the thermal conductivity of the base support 22 in the azimuthal direction is at least 80 W/mK when about 8% by weight of the base support 22 comprises the graphite fibers. When about 90% by weight of the base support 22 comprises the graphite fibers, the thermal conductivity of the base support in the azimuthal direction is less than 900 W/mK. It should be understood that these values are merely exemplary to illustrate the principles of the present disclosure and should not be construed as limiting the scope of the present disclosure.

Figure 5A:
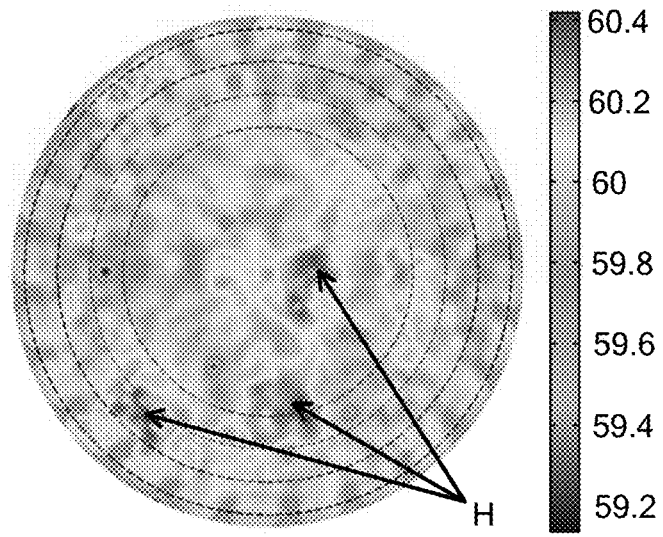
FIG. 5A is a plan view of a thermal profile measured for a support base comprising only a matrix material.

Referring now to FIG. 5A, a heat distribution measured for an apparatus that incorporates a base support 22 of only a Kapton® material matrix (e.g., no thermally conductive members) is shown when the apparatus is heated to a target temperature of about 60° C. The heat distribution exhibits multiple hotspots (H) as shown by the darker/red areas.

Figure 5B:
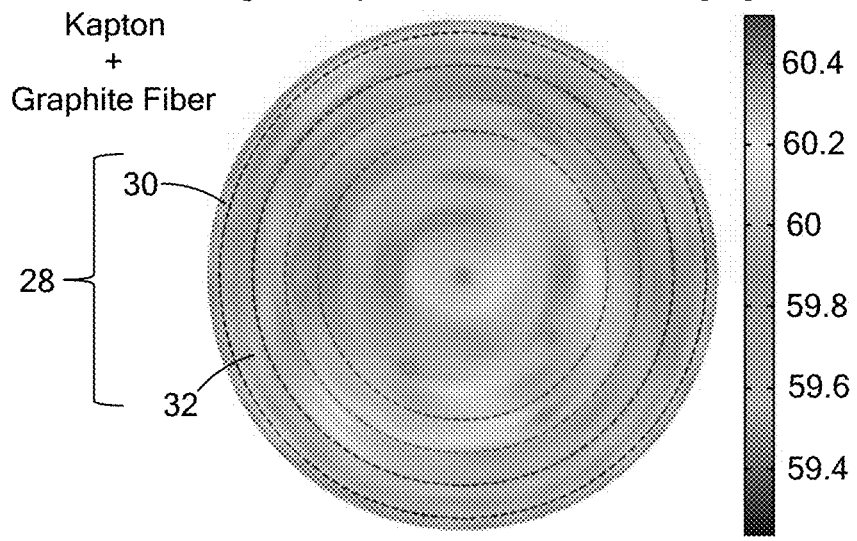
FIG. 5B is a plan view of a thermal profile for a composite support base prepared according to the teachings of the present disclosure.

In comparison, in FIG. 5B, the heat distribution as provided by the present disclosure for an apparatus that incorporates a support base comprising a composite of concentrically aligned graphite fibers (i.e., one form of the thermally conductive arcuate members 30) embedded in a Kapton® material matrix is shown. The increase in thermal conductivity provided by the thermally conductive members enables the support base to exhibit a relatively uniform temperature compared to the apparatus of FIG. 5A.

The support base comprising the composite material prepared according to the present disclosure exhibits anisotropic thermal conductivity in the radial, azimuthal, and axial (z) directions in a cylindrical coordinate system. In other words, the incorporation of the conductive fibers into the matrix material provides different thermal conductivity along the radial, azimuthal, and axial directions. When the support base is utilized in a heater apparatus, such as that used in a wafer deposition/etching chamber, the support base will significantly improve azimuthal temperature uniformity without significantly affecting the temperature profile along the radial or axial directions.

In another form of the present disclosure, an apparatus is provided that supplies heat to a target part. The apparatus comprises a base support 22 made of a composite material 28 comprising at least one thermally conductive arcuate member 30 embedded within a matrix 32, wherein the composite material 28 provides an anisotropic thermal conductivity in radial, azimuthal, and axial directions of the base support. When desirable the apparatus may further comprise a plurality of thermally conductive arcuate members 30 arranged concentrically and/or define predetermined intervals in a radial direction. These arcuate members 30 may define continuous rings.

Figure 6:
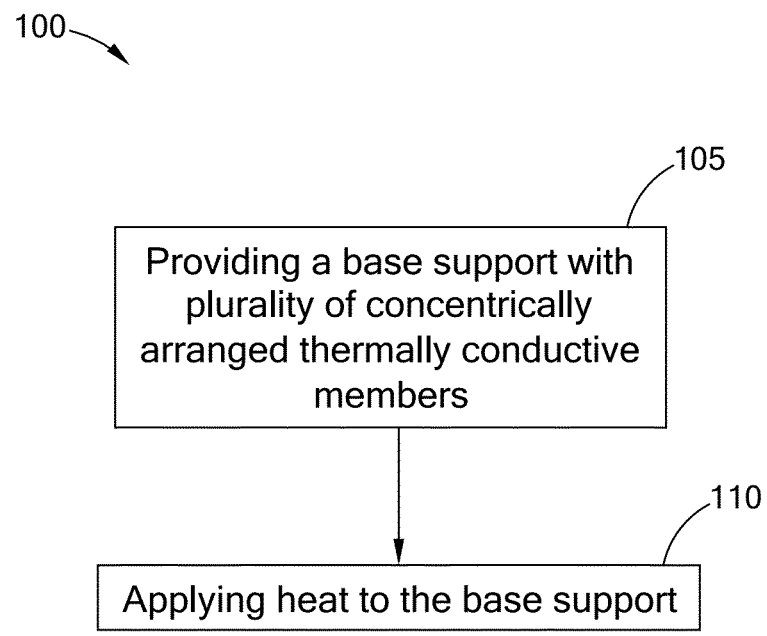
FIG. 6 is a schematic representation of a method of providing heat to a target part according to the teachings of the present disclosure.

In still another form of the present disclosure, a method 100 of providing heat to a target part is provided. Referring now to FIG. 6, this method 100 comprises providing 105 a base support made of a composite material and applying heat 110 to the base support through an adjacent component. The composite material may comprise a plurality of thermally conductive members embedded within a matrix material, each of the plurality thermally conductive members being arranged concentrically and defining predetermined intervals in a radial direction. The composite material may also provide an anisotropic thermal conductivity in radial, azimuthal, and axial directions of the base support.

It should be noted that the disclosure is not limited to the embodiments described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present application.

What is claimed is:

1. An apparatus for supporting a substrate in a process chamber and regulating surface temperature of the substrate, the apparatus comprising:
   a base support including a surface adapted to support the substrate; and
   a heater for heating the substrate, the heater disposed proximate the base support,
   wherein the base support is made of a composite material comprising a plurality of thermally conductive arcuate members embedded within a matrix, the plurality of thermally conductive arcuate members being arranged concentrically and defining predetermined intervals with spacing in a radial direction such that the thermal conductivity in an azimuthal direction (φ) of the base support is higher than that in the radial direction (ρ) and that in an axial direction (z) of the base support and such that heat from the heater is uniformly distributed along the azimuthal direction of the base support, and wherein the plurality of thermally conductive arcuate members are separate from an electrical circuit of the heater and are heated by heat transfer from the heater.

2. The apparatus according to claim 1, wherein the plurality of thermally conductive arcuate members define continuous rings.

3. The apparatus according to claim 1, wherein the plurality of thermally conductive arcuate members define symmetrical segments arranged in zones.

4. The apparatus according to claim 1, wherein the plurality of thermally conductive arcuate members define different lengths.

5. The apparatus according to claim 1, wherein the plurality of thermally conductive arcuate members define different materials.

6. The apparatus according to claim 1, wherein at least one of the plurality of thermally conductive arcuate members defines a variable width.

7. The apparatus according to claim 1, wherein at least one of the plurality of thermally conductive arcuate members defines a variable trace geometry.

8. The apparatus according to claim 1, wherein the matrix is a polyimide material.

9. The apparatus according to claim 8, wherein the polyimide material is a poly-oxydiphenylene-pyromellitimide material.

10. The apparatus according to claim 1, wherein the thermally conductive arcuate members are graphite fibers.

11. The apparatus according to claim 10, wherein the thermal conductivity of the base support in the radial and axial directions is at least 0.4 W/mK when about 10% by weight of the base support comprises the graphite fibers.

12. The apparatus according to claim 10, wherein the thermal conductivity of the base support in the radial and axial directions is less than 6.0 W/mK when about 88% by weight of the base support comprises the graphite fibers.

13. The apparatus according to claim 10, wherein the thermal conductivity of the base support in the azimuthal direction is at least 80 W/mK when about 8% by weight of the base support comprises the graphite fibers.

14. The apparatus according to claim 10, wherein the thermal conductivity of the base support in the azimuthal direction is less than 900 W/mK when about 90% by weight of the base support comprises the graphite fibers.

15. The apparatus according to claim 1, wherein the heater is a layered heater.

16. An apparatus for providing heat to a target part, the apparatus comprising a base support made of a composite material comprising at least one thermally conductive arcuate member embedded within a matrix, wherein the composite material provides an anisotropic thermal conductivity in radial (ρ), azimuthal (φ) and axial (z) directions in a cylindrical coordinate system of the base support, wherein the at least one thermally conductive arcuate member is arranged such that the thermal conductivity of the azimuthal direction is higher than the radial or axial directions and such that heat applied to the base support is uniformly distributed along the azimuthal direction of the base support, and wherein the at least one thermally conductive arcuate member is separate from an electrical circuit of a heater and is heated by heat transfer from the heater.

17. The apparatus according to claim 16, further comprising a plurality of thermally conductive arcuate members arranged concentrically and defining predetermined intervals in a radial direction.

18. The apparatus according to claim 17, wherein the plurality of thermally conductive arcuate members define continuous rings.

19. A method of providing heat to a target part comprising:

providing a base support made of a composite material comprising a plurality of thermally conductive arcuate members embedded within a matrix, the plurality thermally conductive arcuate members being arranged concentrically and defining predetermined intervals with spacing in a radial direction; and applying heat to the base support through an adjacent component, wherein the thermal conductivity in an azimuthal direction (φ) of the base support is higher than that in the radial direction (ρ) and that in an axial direction (z) of the base support and such that the heat applied to the base support is uniformly distributed along the azimuthal direction of the base support, and wherein the plurality of thermally conductive arcuate members are separate from an electrical circuit of a heater and are heated by heat transfer from the heater.

* * * * *